(12) United States Patent
Lee et al.

(10) Patent No.: US 8,378,476 B2
(45) Date of Patent: Feb. 19, 2013

(54) INTEGRATED CIRCUIT PACKAGING SYSTEM WITH STACKING OPTION AND METHOD OF MANUFACTURE THEREOF

(75) Inventors: SeongMin Lee, Seoul (KR); SeongHun Mun, Incheon (KR); Byung Joon Han, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 182 days.

(21) Appl. No.: 12/731,870

(22) Filed: Mar. 25, 2010

(65) Prior Publication Data

US 2011/0233747 A1 Sep. 29, 2011

(51) Int. Cl.
*H01L 23/02* (2006.01)
(52) U.S. Cl. ........ 257/686; 257/723; 257/737; 257/778; 438/109
(58) Field of Classification Search .......... 257/686, 257/723, 737, 778, E23.003, E21.099; 438/109
See application file for complete search history.

(56) References Cited

U.S. PATENT DOCUMENTS

| | | | |
|---|---|---|---|
| 5,309,026 A | 5/1994 | Matsumoto | |
| 6,316,829 B1 | 11/2001 | Boon et al. | |
| 7,185,426 B1 | 3/2007 | Hiner et al. | |
| 7,345,361 B2 | 3/2008 | Mallik et al. | |
| 7,618,846 B1 * | 11/2009 | Pagaila et al. | 438/113 |
| 7,642,133 B2 | 1/2010 | Wu et al. | |
| 7,675,152 B2 | 3/2010 | Gerber et al. | |
| 7,714,453 B2 | 5/2010 | Khan et al. | |
| 2005/0133913 A1 | 6/2005 | Okamoto | |
| 2008/0003718 A1 | 1/2008 | Estepa et al. | |
| 2008/0073769 A1 | 3/2008 | Wu et al. | |
| 2008/0284045 A1 * | 11/2008 | Gerber et al. | 257/778 |
| 2009/0250810 A1 | 10/2009 | Pendse | |

OTHER PUBLICATIONS

U.S. Appl. No. 12/714,320, filed Feb. 26, 2010, Yang et al.
U.S. Appl. No. 12/711,250, filed Feb. 23, 2010, Chi et al.
U.S. Appl. No. 12/410,945, filed Mar. 25, 2009, Chi et al.
U.S. Appl. No. 12/434,367, filed May 1, 2009, Chi et al.

* cited by examiner

*Primary Examiner* — Theresa T Doan
(74) *Attorney, Agent, or Firm* — Ishimaru & Associates LLP; Mikio Ishimaru

(57) ABSTRACT

A method of manufacture of an integrated circuit packaging system includes: fabricating a base package substrate having a component side and a system side; coupling a first integrated circuit die on the component side; coupling stacking interconnects on the component side around the first integrated circuit die; forming a package body on the component side, the first integrated circuit die, and the stacking interconnects; forming vertical insertion cavities through the package body and on the stacking interconnects; and forming a trench, in the package body, adjacent to the vertical insertion cavities for reducing a package warping stress.

20 Claims, 5 Drawing Sheets

INTEGRATED CIRCUIT PACKAGING SYSTEM WITH STACKING OPTION AND METHOD OF MANUFACTURE THEREOF

CROSS-REFERENCE TO RELATED APPLICATION

The present application contains subject matter related to co-pending U.S. patent application Ser. No. 12/714,320 filed Feb. 26, 2010, now U.S. Pat. No. 8,067,306. The related application is assigned to STATS ChipPAC Ltd. and the subject matter thereof is incorporated herein by reference thereto.

TECHNICAL FIELD

The present invention relates generally to an integrated circuit package system, and more particularly to a system for package-on-package stacking including control of the warpage thereof.

BACKGROUND ART

Important and constant goals of the computer industry include higher performance, lower cost, increased miniaturization of components, and greater packaging density for integrated circuits ("ICs"). As new generations of IC products are released, the number of IC devices needed to fabricate them tends to decrease due to advances in technology. Simultaneously, the functionality of these IC products increases. For example, on the average there is approximately a 10 percent decrease in components required for every IC product generation over a previous generation having equivalent functionality.

Semiconductor package structures continue to become thinner and ever more miniaturized. This results in increased component density in semiconductor packages and decreased sizes of the IC products in which the packages are used. These developmental trends are in response to continually increasing demands on electronic apparatus designers and manufacturers for ever-reduced sizes, thicknesses, and costs, along with continuously improving performance.

These increasing requirements for miniaturization are particularly noteworthy, for example, in portable information and communication devices such as cell phones, hands-free cell phone headsets, personal data assistants ("PDAs"), camcorders, notebook personal computers, and so forth. All of these devices continue to be made smaller and thinner to improve their portability. Accordingly, large-scale integration ("LSI") packages incorporated into these devices, as well as the package configurations that house and protect them, must also be made smaller and thinner.

Many conventional semiconductor chip or die packages are of the type having a semiconductor die molded into a package with a resin, such as an epoxy molding compound. The packages have a leadframe whose out leads are projected from the package body to provide a path for signal transfer between the chip and external devices. Other conventional package configurations have contact terminals or pads formed directly on the surface of the package.

In IC packaging, in addition to component size reduction, surface mount technology ("SMT") has demonstrated an increase in semiconductor chip density on a single substrate (such as a printed circuit board ("PCB")) despite the reduction in the number of components. SMT is a method used to connect packaged chips to substrates. With SMT, no through-holes in the substrate are required. Instead, package leads are soldered directly to the substrate surface. This results in more compact designs and form factors, and a significant increase in IC density and performance. However, despite these several reductions in size, IC density continues to be limited by the space or "real estate" available for mounting chips on a substrate.

One method to further increase IC density is to stack semiconductor chips vertically. Multiple stacked chips can be combined into a single package in this manner with a very small surface area or "footprint" on the PCB or other substrate. This strategy of stacking IC components vertically has in fact been extended to the stacking of entire packages upon each other. Such package-on-package ("PoP") configurations continue to become increasingly popular as the semiconductor industry continues to demand semiconductor devices with lower costs, higher performance, increased miniaturization, and greater packaging densities. Continuing substantial improvements in PoP technology are anticipated to address these requirements.

Unfortunately, limitations of current PoP stacking techniques can interfere with the ready incorporation and utilization of existing die and package configurations. It can reduce the effective reliability of the package due to movement of the packages with changes in temperature. The movement or warping of package substrates can damage die exposed on a base substrate or fracture interconnects between the substrates.

For example, in a previous PoP configuration, the base package has bonding pads on the top side that allow surface mounting of a top or second package. In order to successfully and effectively mount the top package on the base package, it is necessary to have sufficient clearance or "headroom" between the packages for accommodating structures, such as dies or a mold cap, on the top of the base package. However, typically due to cost and efficiency considerations, the only physical structure connecting the top package and the base package is the electrical interface between them. This electrical interface is usually a solder ball matrix on the bottom of the top package that aligns with bonding pads on the top of the base package.

Previous techniques employing such solder ball matrices usually afford only a small space or stand-off provided by the nominal height of the solder balls. This limits the available height for the base package components on the top of the base package, such as one or more semiconductor dice. Since the primary goal of the integration is to reduce the size of the package clearances are held to a minimum.

The problem of limited space between the base package and the top package increases the critical dimensions and manufacturing difficulty of the PoP. The integrated circuit die on the base package, if exposed, may be damaged during or after assembly by the movement of the two packages caused by different rates of thermal expansion and rigidity.

Thus, while a need still remains for smaller, thinner, lighter, less-expensive integrated circuit PoP systems, a great need also remains for PoP systems that simplify the assembly process and help address the warping issue that can damage the integrated circuit die of the base package. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: fabricating a base package substrate having a component side and a system side; coupling a first integrated circuit die on the component side; coupling stacking interconnects on the component side around the first integrated circuit die; forming a package body on the component side, the first integrated circuit die, and the stacking interconnects; forming vertical insertion cavities through the package body and on the stacking interconnects; and forming a trench, in the package body, adjacent to the vertical insertion cavities for reducing a package warping stress.

The present invention provides an integrated circuit packaging system, including: a base package substrate having a component side and a system side; a first integrated circuit die coupled on the component side; stacking interconnects on the component side coupled around the first integrated circuit die; a package body formed on the component side, the first integrated circuit die, and the stacking interconnects; vertical insertion cavities through the package body and on the stacking interconnects; and a trench, in the package body, adjacent to the vertical insertion cavities for reducing a deformation height.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
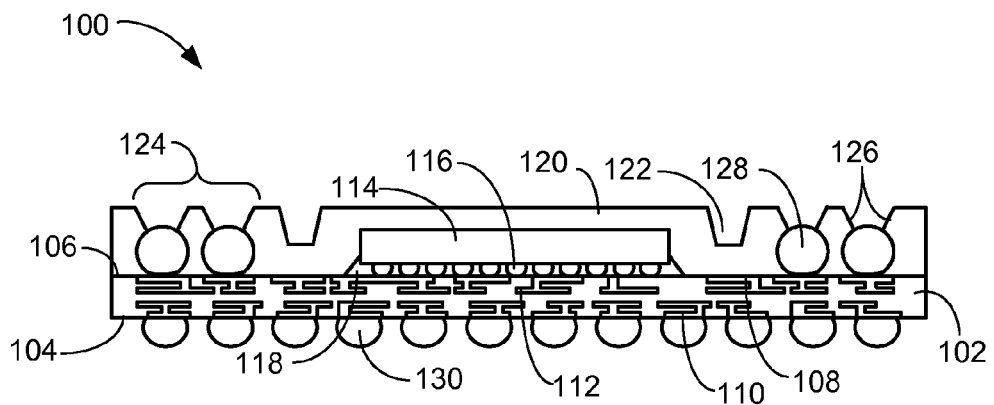
FIG. 1 is a cross-sectional view of an integrated circuit packaging system with stacking capability taken along a line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGS. Similarly, although the views in the drawings for ease of description generally show similar orientations, this depiction in the FIGS. is arbitrary for the most part. Generally, the invention can be operated in any orientation.

Where multiple embodiments are disclosed and described, having some features in common, for clarity and ease of illustration, description, and comprehension thereof, similar and like features one to another will ordinarily be described with similar reference numerals.

For expository purposes, the term "horizontal" as used herein is defined as a plane parallel to the plane or surface of the integrated circuit die, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between two elements with no intervening materials.

The term "processing" as used herein includes deposition of material or photoresist, patterning, exposure, development, etching, laser ablation, cleaning, and/or removal of the material or photoresist as required in forming a described structure.

Figure 2:
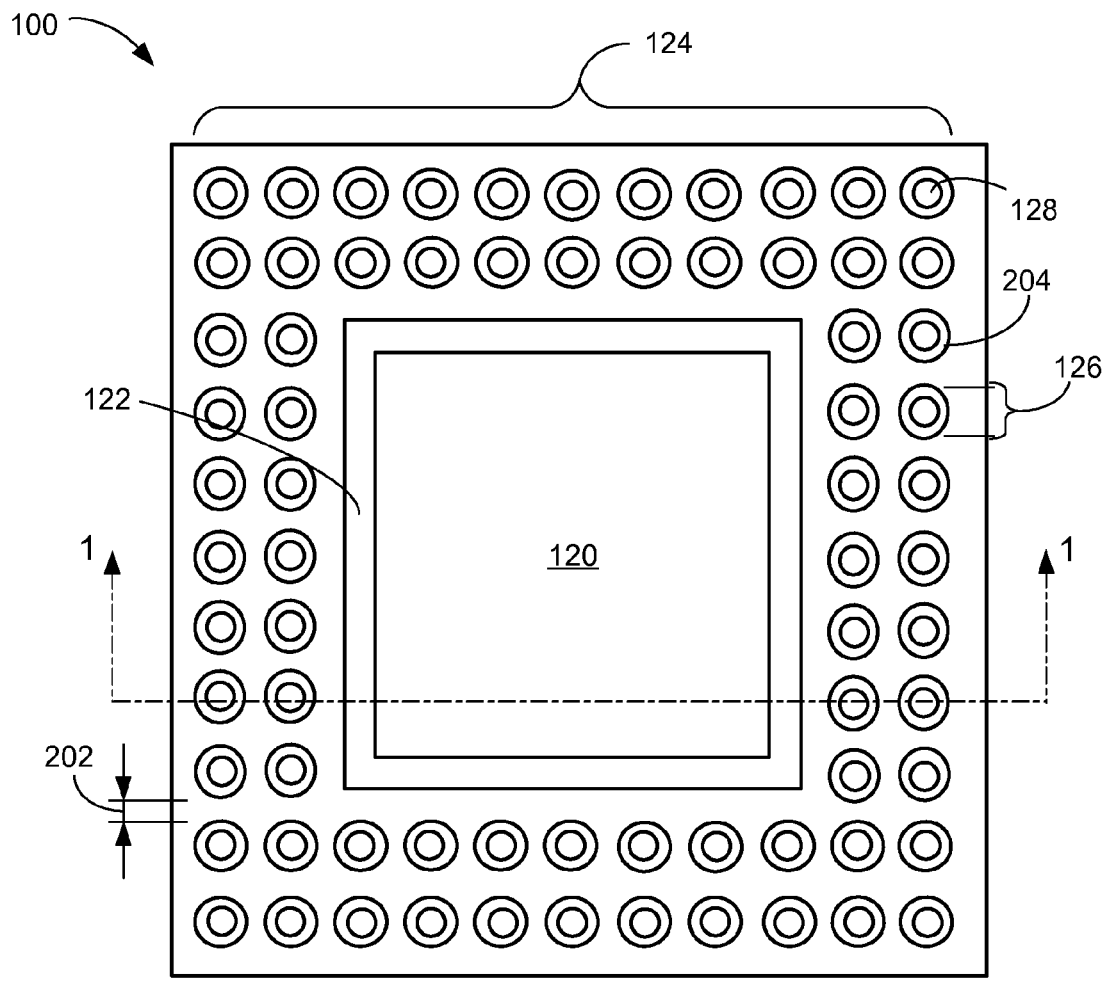
FIG. 2 is a top view of the integrated circuit packaging system of FIG. 1.

Referring now to FIG. 1, therein is shown a cross-sectional view of an integrated circuit packaging system 100 with stacking capability taken along a line 1-1 of FIG. 2 in a first embodiment of the present invention. The cross-sectional view of the integrated circuit packaging system 100 depicts a base package substrate 102 having a system side 104 and a component side 106.

Component pads 108 on the component side 106 may be coupled to system pads 110 on the system side 104 by internal circuitry 112, such as traces, vias, or a combination thereof. A first integrated circuit die 114, such as a flip chip die, may be coupled to the component pads by chip interconnects 116.

An adhesive material 118, such as under fill material, may be applied between the first integrated circuit die 114 and the component side 106. The adhesive material 118 may completely enclose the chip interconnects 116 and the active side of the first integrated circuit die 114.

A package body 120 may be formed by injection molding of an epoxy molding compound to cover the component side 106 of the base package substrate 102 and the first integrated circuit die 114. A trench 122, such as a stress relieving trench may be formed adjacent to the first integrated circuit die 114. The trench 122 may penetrate the package body 120 to a depth below a surface, such as the inactive surface, of the first integrated circuit die 114.

It has been discovered that the forming of the package body 120 on the base package substrate 102 may deform or warp the base package substrate 102. This deformation of the base package substrate 102 may stress or fracture the chip interconnects 116 between the first integrated circuit die 114 and the component side 106.

In order to counteract the stress forces induced by curing the epoxy molding compound of the package body 120 the trench 122 may be formed in the package body 120 between the first integrated circuit die 114 and an array 124 of vertical insertion cavities 126 that may be formed in the package body 120 by a laser ablation process, an etch process, or other molding removal process. This process may be identified by the evidence of melting on the sidewalls of each of the vertical insertion cavities 126, which can be non-horizontal insertion cavities with sloped non-horizontal sidewalls.

Stacking interconnects 128, such as solder balls, may be formed on the component side 106 of the base package substrate 102 prior to forming the package body 120. The stacking interconnects 128, may have been exposed by the vertical insertion cavities 126, form an electrical connection between the first integrated circuit die 114, system interconnects 130, formed on the system pads 110, another of the stacking interconnects 128, or a combination thereof.

It has been discovered that the present invention provides the integrated circuit packaging system 100 with package stacking capability. The stacking interconnects 128 in the vertical insertion cavities 126 of the package body 120 provide high density electrical connectivity for package stacking. The stacking interconnects 128 in the vertical insertion cavities 126 also reduces the keep out zones due to the package body 120 acting as a barrier between the stacking interconnects 128 and the reduction of the keep out zones allows a further increase in the density of the stacking interconnects 128 for reliable stacking of high I/O count integrated circuit devices (not shown).

It has also been discovered that the present invention provides the integrated circuit packaging system 100 with higher reliability and higher yield. The package body 120 with the trench 122 and the vertical insertion cavities 126 reduces warpage and mechanical damage while improving surface mount technology yield. The reduction in warpage also improves reliability of the integrated circuit packaging system 100.

Referring now to FIG. 2, therein is shown a top view of the integrated circuit packaging system 100 of FIG. 1. The top view of the integrated circuit packaging system 100 depicts the package body 120 having the array 124 of the vertical insertion cavities 126 positioned around the top side of the integrated circuit packaging system 100.

The array 124 of the vertical insertion cavities 126 may be precisely positioned by the laser ablation process. A wall thickness 202 may be precisely set to provide an increase in the number of the stacking interconnects 128 available. A melted area 204 may exist around the opening at the stacking interconnects 128. The melted area 204 may be created by the process that forms the vertical insertion cavities 126.

Positioned on the interior of the array 124 of the vertical insertion cavities 126, the trench 122 may also be formed by a laser ablation process to include vertical or sloped sidewalls that show evidence of melting. The trench 122 continuously surrounds a central region of the top surface of the package body 120. The actual position and dimensions of the trench 122 may differ for different combinations of the base package substrate 102 and the first integrated circuit die 114. The number and position of the vertical insertion cavities 126 may also impact the position and depth of the trench 122.

It has been discovered that the increase in the number of the vertical insertion cavities 126 does not decrease the ability of the trench 122 to reduce the warpage of the base package substrate 102. It is also understood that the trench 122 may further reduce the stresses associated with the forming and curing of the package body 120.

Figure 3:
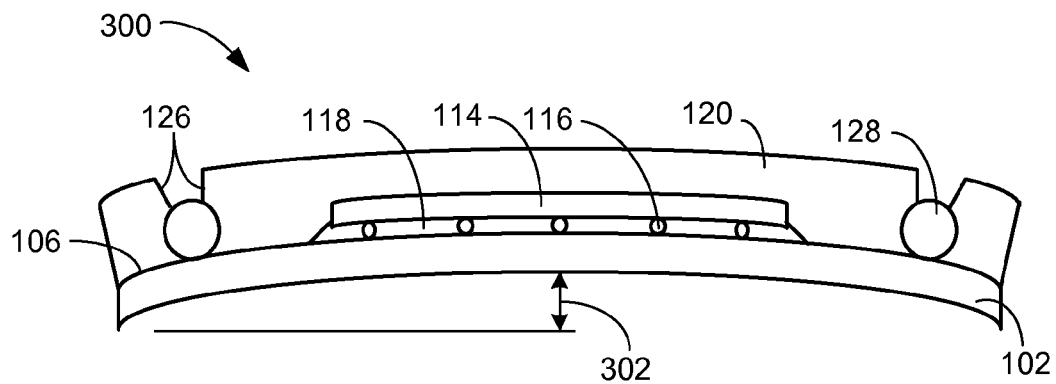
FIG. 3 is a cross-sectional view of an integrated circuit packaging system with package stacking capability in a convex warped state.

Referring now to FIG. 3, therein is shown a cross-sectional view of an integrated circuit packaging system 300 with package stacking capability in a convex warped state. The cross-sectional view of the integrated circuit packaging system 300 depicts the base package substrate 102 having the first integrated circuit die 114 attached to the component side 106 by the chip interconnects 116. The adhesive material 118 may apply additional stress to the first integrated circuit die 114 in the convex warped state.

The number and position of the stacking interconnects 128 with the vertical insertion cavities 126 may be insufficient to prevent a convex deformation of the base package substrate 102 and the package body 120. The resulting stress on the first integrated circuit die 114 and the chip interconnects 116 may cause fracture damage and component failure as well as misalignment with potentially stacked package (not shown).

The convex warp state of the integrated circuit packaging system 300 may have a deformation height 302 that is in the range of 0 to 15 percent of the thickness of the integrated circuit packaging system 300. The stress that causes the deformation may yield slightly in operational temperatures or it may increase and eventually cause failure of the integrated circuit packaging system 300.

Figure 4:
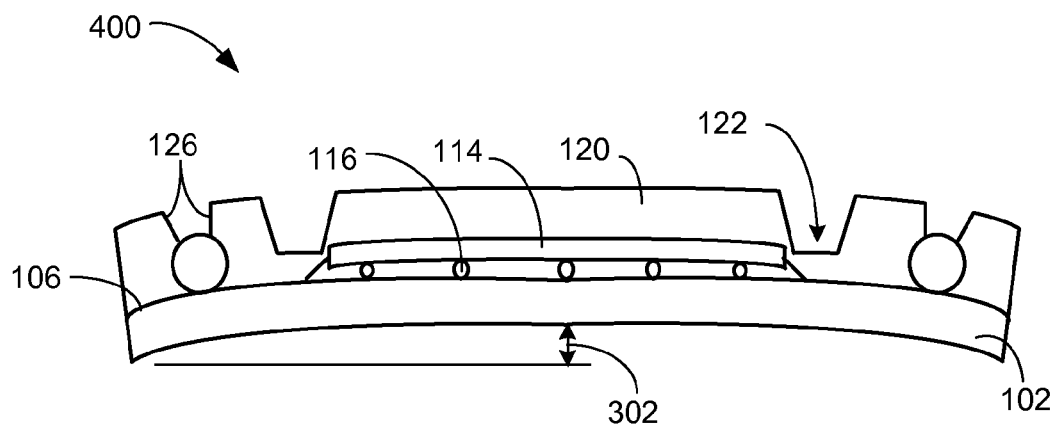
FIG. 4 is a cross-sectional view of an integrated circuit packaging system with package stacking capability in a first stress relieved state.

Referring now to FIG. 4, therein is shown a cross-sectional view of an integrated circuit packaging system 400 with package stacking capability in a first stress relieved state. The cross-sectional view of the integrated circuit packaging system 400 depicts the base package substrate 102 having the first integrated circuit die 114 attached to the component side 106 by the chip interconnects 116.

As compared to the integrated circuit packaging system 300, the deformation height 302 has been reduced by the addition of the trench 122 in the package body 120. The trench 122 is located adjacent to the first integrated circuit die 114 in order to provide local stress relief. The position and depth of the trench 122 may vary depending on the magnitude of the deformation height 302.

It has been discovered that the formation of the trench 122 in the package body 120 may provide a reduction in the stress forces that cause the deformation of the base package substrate 102. The resulting decrease in the deformation height 302 is primarily cause by a flattening of the base package substrate 102 under the first integrated circuit die 114.

The removal of the deformation stresses from the first integrated circuit die 114 may increase the reliability of the integrated circuit packaging system 400 in the manufacturing process and in the operational life of the first integrated circuit die 114. The trench 122 may be positioned adjacent to the vertical insertion cavities 126 in order to increase the flattening effect and relieve stress in the base package substrate 102.

It is understood that the depth of the trench 122 is an example only and the actual depth may vary depending on the severity of the forces causing the convex warped state. The dimensions of the trench 122 are also an example and may vary based on the need to relieve stress in the base package substrate 102.

Figure 5:
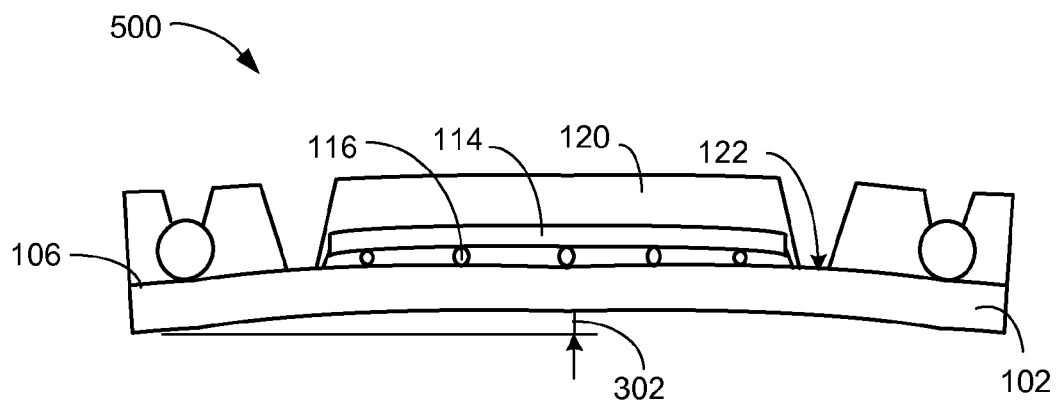
FIG. 5 is a cross-sectional view of an integrated circuit packaging system with package stacking capability in a warped state.

Referring now to FIG. 5, therein is shown a cross-sectional view of an integrated circuit packaging system 500 with package stacking capability in a warped state. The cross-sectional view of the integrated circuit packaging system 500 depicts the base package substrate 102 having the first integrated circuit die 114 attached to the component side 106 by the chip interconnects 116.

As compared to the integrated circuit packaging system 400, the deformation height 302 has been further reduced by the increase of the depth of the trench 122 in the package body 120. The trench 122 is located adjacent to the first integrated circuit die 114 in order to provide local stress relief. The position and depth of the trench 122 may vary depending on the magnitude of the deformation height 302.

The trench 122 may penetrate completely through the package body 120 to expose the base package substrate 102. In the case shown, the region surrounded by the trench 122 may be substantially flat. The forces associated with the convex warped state may be locally counteracted by the position and depth of the trench 122.

It has been discovered that the trench 122 exposing the base package substrate 102 adjacent to the first integrated circuit die 114 may resolve most of the forces exerted on the first integrated circuit die 114. By moving the trench 122 closer to the vertical insertion cavities 126 the overall flatness may be increased but the relative flatness of the region under the first integrated circuit die 114 may be slightly degraded. Optimally, a position between the first integrated circuit die 114 and the vertical insertion cavities 126 is identified as the best resolution for the convex warped state.

Figure 6:
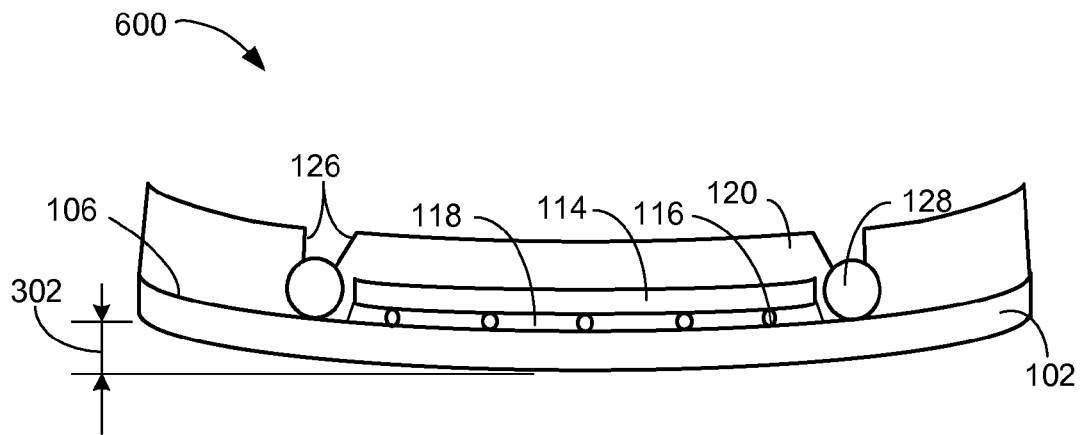
FIG. 6 is a cross-sectional view of an integrated circuit packaging system with package stacking capability in a concave warped state.

Referring now to FIG. 6, therein is shown a cross-sectional view of an integrated circuit packaging system 600 with package stacking capability in a concave warped state. The cross-sectional view of the integrated circuit packaging system 600 depicts the base package substrate 102 having the first integrated circuit die 114 attached to the component side 106 by the chip interconnects 116. The adhesive material 118 may apply additional stress to the first integrated circuit die 114 in the concave warped state.

The number and position of the stacking interconnects 128 with the vertical insertion cavities 126 may be insufficient to prevent a concave deformation of the base package substrate 102 and the package body 120. The resulting stress on the first integrated circuit die 114 and the chip interconnects 116 may cause fracture damage and component failure as well as misalignment with potentially stacked package (not shown).

The concave warp state of the integrated circuit packaging system 600 may have the deformation height 302 that is in the range of 0 to 15 percent of the thickness of the integrated circuit packaging system 600. The stress that causes the deformation may yield slightly in operational temperatures or it may increase and eventually cause failure of the integrated circuit packaging system 600.

Figure 7:
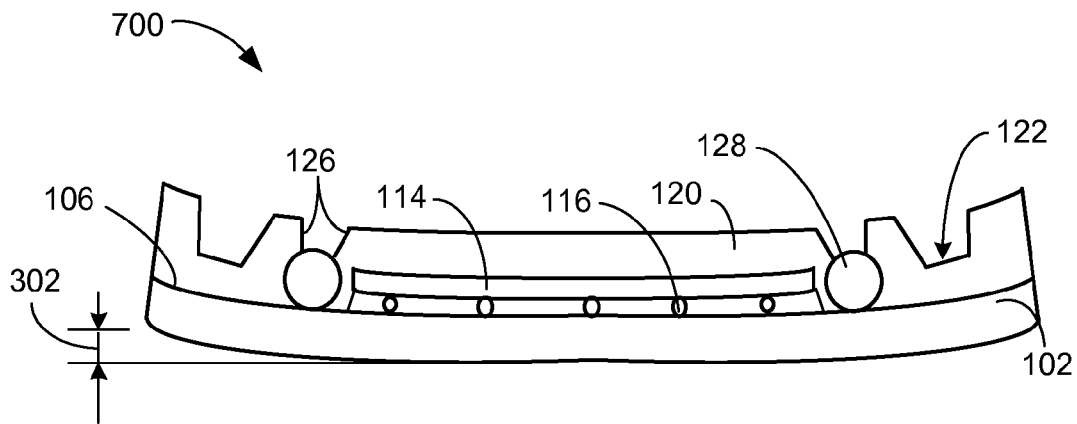
FIG. 7 is a cross-sectional view of an integrated circuit packaging system with package stacking capability in a first stress relieved state.

Referring now to FIG. 7, therein is shown a cross-sectional view of an integrated circuit packaging system 700 with package stacking capability in a first stress relieved state. The cross-sectional view of the integrated circuit packaging system 700 depicts the base package substrate 102 having the first integrated circuit die 114 attached to the component side 106 by the chip interconnects 116.

As compared to the integrated circuit packaging system 600, the deformation height 302 has been reduced by the addition of the trench 122 in the package body 120. The trench 122 is located adjacent to the vertical insertion cavities 126 in order to provide local stress relief. The position and depth of the trench 122 may vary depending on the magnitude of the deformation height 302.

It has been discovered that the formation of the trench 122 in the package body 120 may provide a reduction in the stress forces that cause the deformation of the base package substrate 102. The resulting decrease in the deformation height 302 is primarily cause by a flattening of the base package substrate 102 under the first integrated circuit die 114.

The removal of the deformation stresses from the first integrated circuit die 114 may increase the reliability of the integrated circuit packaging system 700 in the manufacturing process and in the operational life of the first integrated circuit die 114. The trench 122 may be positioned adjacent to the vertical insertion cavities 126 in order to increase the flattening effect and relieve stress in the base package substrate 102.

It is understood that the depth of the trench 122 is an example only and the actual depth may vary depending on the severity of the forces causing the concave warped state. The dimensions of the trench 122 are also an example and may vary based on the need to relieve stress in the base package substrate 102. In some designs of the integrated circuit packaging system 700, having multiple rows of the vertical insertion cavities 126, a trench 122 may be placed between the rows of the vertical insertion cavities 126 in order to reduce the forces associated with the concave warped state.

Figure 8:
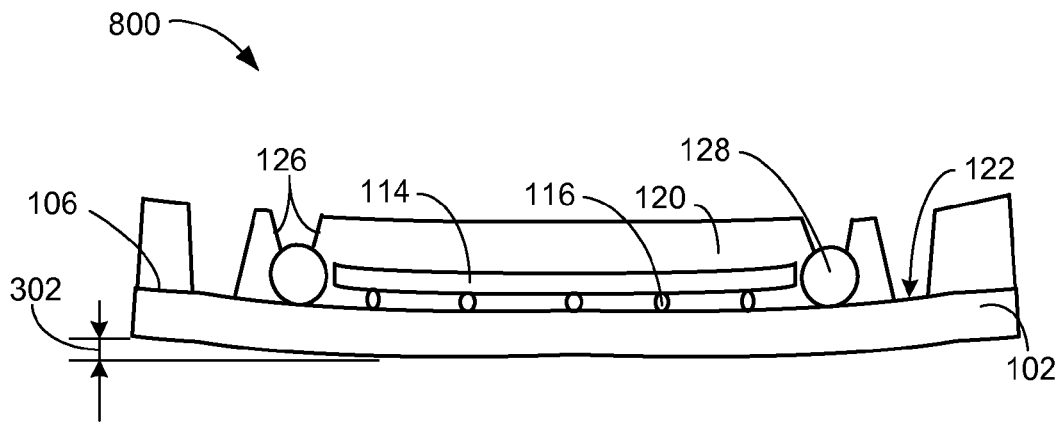
FIG. 8 is a cross-sectional view of an integrated circuit packaging system with package stacking capability in a second stress relieved state.

Referring now to FIG. 8, therein is shown a cross-sectional view of an integrated circuit packaging system 800 with package stacking capability in a second stress relieved state. The cross-sectional view of the integrated circuit packaging system 800 depicts the base package substrate 102 having the first integrated circuit die 114 attached to the component side 106 by the chip interconnects 116.

As compared to the integrated circuit packaging system 700, the deformation height 302 has been further reduced by the increase of the depth of the trench 122 in the package body 120. The trench 122 is located adjacent to the vertical insertion cavities 126 in order to provide local stress relief. The position and depth of the trench 122 may vary depending on the magnitude of the deformation height 302.

The trench 122 may penetrate completely through the package body 120 to expose the base package substrate 102. In the case shown, the region surrounded by the trench 122 may be substantially flat. The forces associated with the concave warped state may be locally counteracted by the position and depth of the trench 122.

It has been discovered that the trench 122 exposing the base package substrate 102 adjacent to the vertical insertion cavities 126 may resolve most of the forces exerted on the first integrated circuit die 114. By moving the trench 122 closer to the vertical insertion cavities 126 the overall flatness may be increased but the relative flatness of the region under the first integrated circuit die 114 may be slightly degraded. Optimally, the combination of the positions of the trench 122 and the position of the vertical insertion cavities 126 may be identified as the best resolution for the concave warped state.

Figure 9:
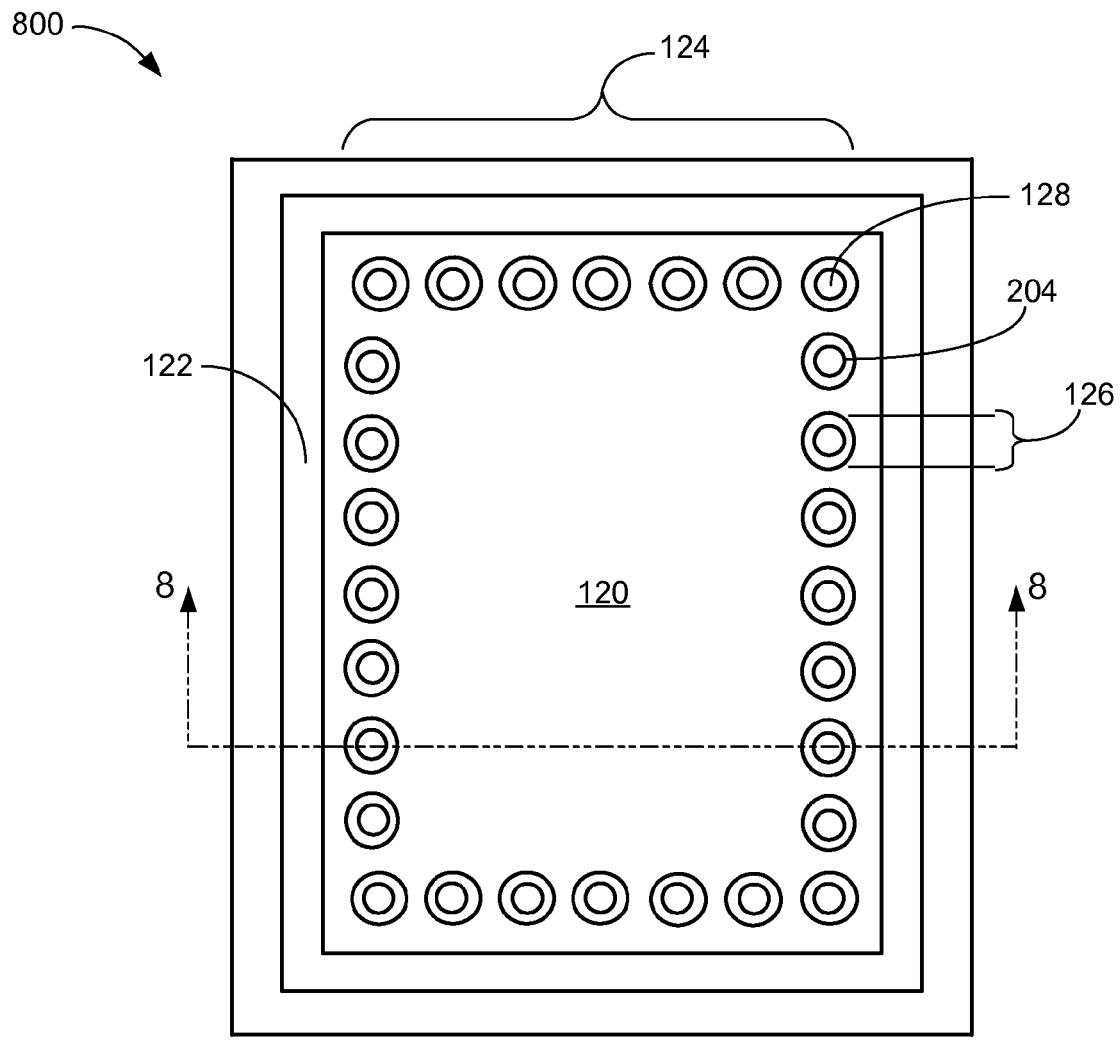
FIG. 9 is a top view of the integrated circuit packaging system with package stacking capability of FIG. 8.

Referring now to FIG. 9, therein is shown a top view of the integrated circuit packaging system 800 with package stacking capability of FIG. 8. The top view of the integrated circuit packaging system 800 depicts the package body 120 having the array 124 of the vertical insertion cavities 126 positioned around the top side of the integrated circuit packaging system 800.

The array 124 of the vertical insertion cavities 126 may be precisely positioned by the laser ablation process. In this example the array 124 has only a single row of the vertical insertion cavities 126, which is surrounded by the trench 122. In other implementations there may be several rows of the vertical insertion cavities 126 having the trench 122 in an adjacent position. In some cases multiple units of the trench 122 may be used to relieve the stress forces and reduce the deformation height 302.

The melted area 204 may exist around the opening at the stacking interconnects 128. The melted area 204 may be created by the process that forms the vertical insertion cavities 126.

Positioned around the exterior of the array 124 of the vertical insertion cavities 126, the trench 122 may also be formed by a laser ablation process, an etch process, or other molding removal process to include vertical or sloped sidewalls that show evidence of melting. The actual position and dimensions of the trench 122 may differ for different combinations of the base package substrate 102 and the first integrated circuit die 114.

The number and position of the vertical insertion cavities 126 may also impact the position and depth of the trench 122. The section line 8-8 indicates the position and direction of view of the cross-section of FIG. 8.

Figure 10:
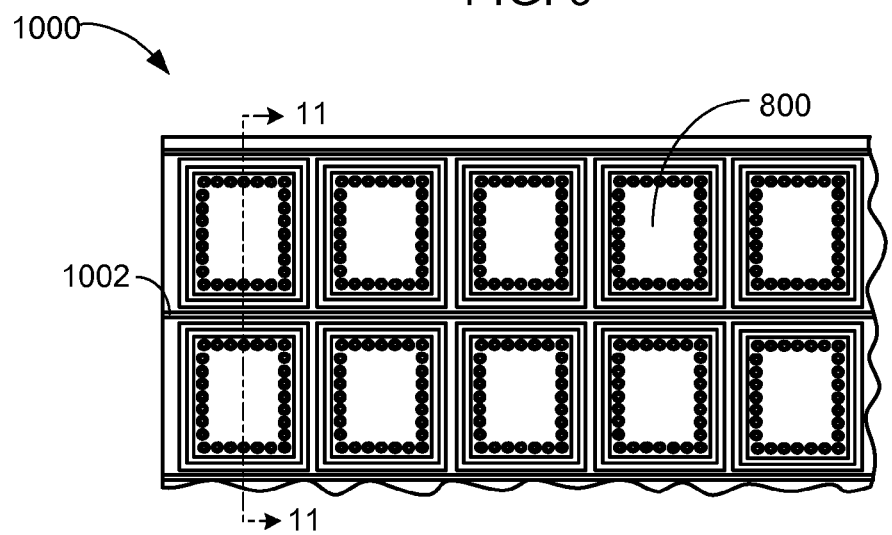
FIG. 10 is a top view of a part of an integrated circuit packaging system assembly strip.

Referring now to FIG. 10, therein is shown a top view of a part of an integrated circuit packaging system assembly strip 1000. The top view of the part of the integrated circuit packaging system assembly strip 1000 depicts an array of the integrated circuit packaging system 800 in a pre-singulation phase of manufacturing.

In addition to the trench 122 formed in the individual units of the integrated circuit packaging system 800, there are notches 1002 that may run along the length of the integrated circuit packaging system assembly strip 1000. The notches 1002 in conjunction with the trench 122 formed on each of the integrated circuit packaging system 800 may reduce the incidence of warping in the integrated circuit packaging system assembly strip 1000.

Figure 11:
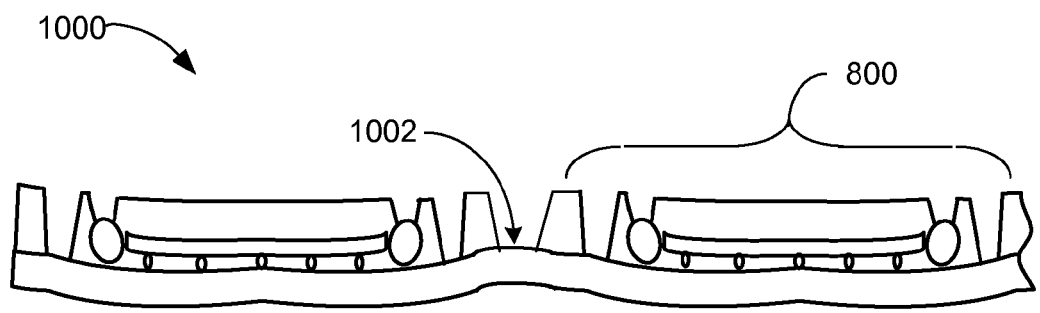
FIG. 11 is a cross-sectional view of the part of the integrated circuit packaging system assembly strip of FIG. 10.

The section line 11-11 indicates the position and direction of view of the cross-section of FIG. 11.

Referring now to FIG. 11, therein is shown a cross-sectional view of the part of the integrated circuit packaging system assembly strip 1000 of FIG. 10. The cross-sectional view of the part of the integrated circuit packaging system assembly strip 1000 depicts two units of the integrated circuit packaging system 800.

The region with the greatest potential for warping is below one of the notches 1002. The presence of one of the notches 1002 in the integrated circuit packaging system assembly strip 1000 reduces the stresses and limits the deformation and warping.

Figure 12:
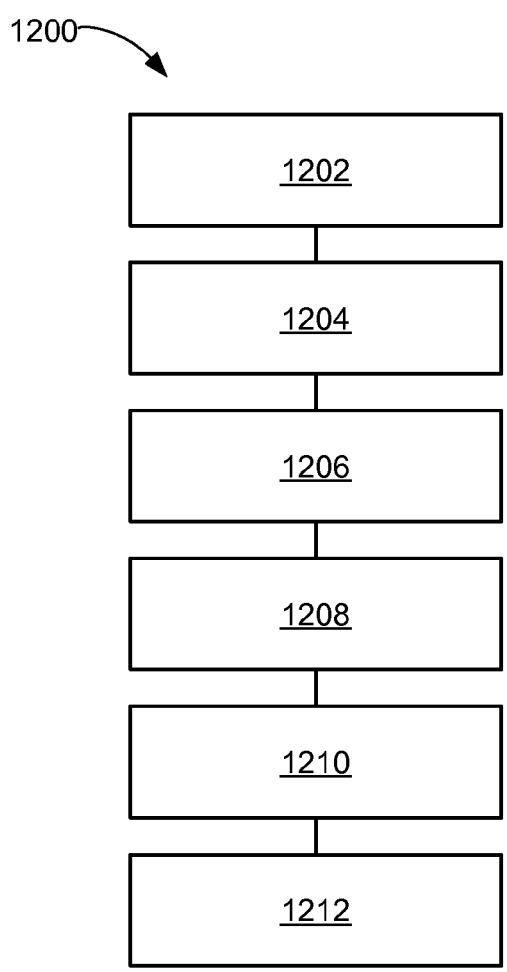
FIG. 12 is a flow chart of a method of manufacture of an integrated circuit packaging system in a further embodiment of the present invention.

Referring now to FIG. 12, therein is shown a flow chart of a method 1200 of manufacture of the integrated circuit packaging system 100 in a further embodiment of the present invention. The method 1200 includes: fabricating a base package substrate having a component side and a system side in a block 1202; coupling a first integrated circuit die on the component side in a block 1204; coupling stacking interconnects on the component side around the first integrated circuit die in a block 1206; forming a package body on the component side, the first integrated circuit die, and the stacking interconnects in a block 1208; forming vertical insertion cavities through the package body and on the stacking interconnects in a block 1210; and forming a trench, in the package body, adjacent to the vertical insertion cavities for reducing a package warping stress in a block 1212.

The resulting method, process, apparatus, device, product, and/system is straightforward, cost-effective, uncomplicated, highly versatile and effective, can be surprisingly and unobviously implemented by adapting known technologies, and are thus readily suited for efficiently and economically manufacturing integrated circuit packaging systems with package stacking capability fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   fabricating a base package substrate having a component side and a system side;
   coupling a first integrated circuit die on the component side;
   coupling stacking interconnects on the component side around the first integrated circuit die;
   forming a package body on the component side, the first integrated circuit die, and the stacking interconnects;
   forming non-horizontal insertion cavities through the package body and on the stacking interconnects; and
   forming a trench, in the package body, the trench continuously surrounding a central region of the package body and adjacent to the non-horizontal insertion cavities for reducing a package warping stress.

2. The method as claimed in claim 1 wherein forming the trench includes positioning the trench between the non-horizontal insertion cavities and the first integrated circuit die.

3. The method as claimed in claim 1 wherein forming the trench includes positioning the trench around the non-horizontal insertion cavities and the first integrated circuit die.

4. The method as claimed in claim 1 wherein forming the trench includes removing a portion of the package body to a level below a surface of the first integrated circuit die.

5. The method as claimed in claim 1 further comprising dividing an integrated circuit packaging system assembly strip having a notch.

6. A method of manufacture of an integrated circuit packaging system comprising:
   fabricating a base package substrate having a component side and a system side including forming a component pad on the component side and a system pad on the system side;
   coupling a first integrated circuit die on the component side including coupling a chip interconnect between the first integrated circuit die and the component pad;
   coupling stacking interconnects on the component side around the first integrated circuit die;
   forming a package body on the component side, the first integrated circuit die, and the stacking interconnects including injection molding an epoxy molding compound;
   forming non-horizontal insertion cavities through the package body and on the stacking interconnects including exposing a top of the stacking interconnect; and
   forming a trench, in the package body, the trench continuously surrounding a central region of the package body and adjacent to the non-horizontal insertion cavities for reducing a package warping stress including reducing a deformation height of the base package substrate.

7. The method as claimed in claim 6 wherein forming the trench includes positioning the trench between the non-horizontal insertion cavities and the first integrated circuit die including reducing a convex warped state of the base package substrate.

8. The method as claimed in claim 6 wherein forming the trench includes positioning the trench around the non-horizontal insertion cavities and the first integrated circuit die including reducing a concave warped state of the base package substrate.

9. The method as claimed in claim 6 wherein forming the trench includes removing a portion of the package body to a level below a surface of the first integrated circuit die including exposing a portion of the component side.

10. The method as claimed in claim 6 further comprising dividing an integrated circuit packaging system assembly strip having a notch.

11. An integrated circuit packaging system comprising:
a base package substrate having a component side and a system side;
a first integrated circuit die coupled on the component side;
stacking interconnects on the component side coupled around the first integrated circuit die;
a package body formed on the component side, the first integrated circuit die, and the stacking interconnects;
non-horizontal insertion cavities through the package body and on the stacking interconnects; and
a trench, in the package body, the trench continuously surrounding a central region of the package body and adjacent to the non-horizontal insertion cavities for reducing a deformation height.

12. The system as claimed in claim 11 wherein the trench, in the package body, includes the trench positioned between the non-horizontal insertion cavities and the first integrated circuit die.

13. The system as claimed in claim 11 wherein the trench, in the package body, includes the trench around the non-horizontal insertion cavities and the first integrated circuit die.

14. The system as claimed in claim 11 wherein the trench, in the package body, includes a portion of the package body removed to a level below a surface of the first integrated circuit die.

15. The system as claimed in claim 11 further comprising an adhesive material between the component side and the first integrated circuit die to enclose chip interconnects.

16. The system as claimed in claim 11 further comprising:
component pads on the component side and system pads on the system side;
chip interconnects between the first integrated circuit die and the component pads;
epoxy molding compound is the package body; and
a top of the stacking interconnect exposed by the non-horizontal insertion cavities.

17. The system as claimed in claim 16 wherein the trench, in the package body, includes the trench positioned between the non-horizontal insertion cavities and the first integrated circuit die for reducing a convex warped state of the base package substrate.

18. The system as claimed in claim 16 wherein the trench, in the package body, includes the trench around the non-horizontal insertion cavities and the first integrated circuit die for reducing a concave warped state of the base package substrate.

19. The system as claimed in claim 16 wherein the trench, in the package body, includes a portion of the package body removed to a level below a surface of the first integrated circuit die and a portion of the component side exposed in the trench.

20. The system as claimed in claim 16 further comprising system interconnects coupled to the system pads of the base package substrate.

\* \* \* \* \*